United States Patent [19]
Sato

[11] Patent Number: 5,723,378
[45] Date of Patent: Mar. 3, 1998

[54] FABRICATION METHOD OF SEMICONDUCTOR DEVICE USING EPITAXIAL GROWTH PROCESS

[75] Inventor: Fumihiko Sato, Tokyo, Japan

[73] Assignee: NEC Corporation, Japan

[21] Appl. No.: 620,122

[22] Filed: Mar. 31, 1996

[30] Foreign Application Priority Data

Mar. 22, 1995 [JP] Japan .................. 7-087651

[51] Int. Cl.$^6$ .................. H01L 21/331
[52] U.S. Cl. .................. 438/309; 438/365; 438/366; 438/369; 438/481
[58] Field of Search .................. 437/31, 32, 33, 437/162, 89, 90

[56] References Cited

U.S. PATENT DOCUMENTS

| | | | |
|---|---|---|---|
| 5,008,209 | 4/1991 | Appels et al. | 437/31 |
| 5,126,285 | 6/1992 | Kosa et al. | 437/31 |
| 5,281,544 | 1/1994 | Higuchi | 437/31 |
| 5,508,213 | 4/1996 | Van Der Wel et al. | 437/31 |
| 5,523,245 | 6/1996 | Imai | 437/31 |
| 5,599,723 | 2/1997 | Sato | 437/89 |

FOREIGN PATENT DOCUMENTS

| | | |
|---|---|---|
| 4188716 | 7/1992 | Japan . |
| 4330730 | 11/1992 | Japan . |
| 5160142 | 6/1993 | Japan . |

OTHER PUBLICATIONS

Sato et al; "Self–Aligned" Selective MBE Technology for High–Performance Bipolar Transistors; 1990; pp. 1–4; IEEE.

Sato et al; "A Novel Selective SiGe Epitaxial Growth Technology for Self–Aligned HBTs"; 1992; pp. 62–63; Symposium on VLSI Technology Digest of Technical Papers.

Gummel; "Measurement of the Number Impurities in the Base Layer of a Transistor"; Apr. 1961; p. 834; Proceeding of the IRE.

*Primary Examiner*—Tuan H. Nguyen
*Attorney, Agent, or Firm*—Hayes, Soloway, Hennessey, Grossman & Hage, P.C.

[57] ABSTRACT

A fabrication method of a semiconductor device in which a single-crystal semiconductor layer can be epitaxially grown on an entire growth surface with less or no thickness fluctuation. A first insulating film is formed on a first single-crystal semiconductor layer of a first conductivity type. A first polycrystalline semiconductor film and a second insulating film are selectively formed on the first insulating film. The first insulating film is exposed through a first opening formed between the first polycrystalline semiconductor film and the second insulating film. The first insulating film is selectively removed using the first polycrystalline semiconductor film and the second insulating film as a mask, thereby forming a second opening greater in plan size than the first opening. A second single-crystal semiconductor layer of the second conductivity type is epitaxially grown on the first single-crystal semiconductor layer in the second opening. The thickness of the second single-crystal semiconductor layer is defined by the height of the second opening, i.e., the thickness of the first insulating film.

7 Claims, 14 Drawing Sheets ly provided between the surface of the substructure 200
FABRICATION METHOD OF SEMICONDUCTOR DEVICE USING EPITAXIAL GROWTH PROCESS

BACKGROUND OF THE INVENTION

1. Field of the Invention

The present invention relates to a fabrication method of a semiconductor device and more particularly, to a fabrication method of a semiconductor device using an epitaxial growth process, which is applicable to fabrication of a bipolar transistor.

2. Description of the Prior Art

To improve the high-frequency characteristics of a bipolar transistor, the base layer or region needs to be as thin as possible.

It has been known that an ion-implantation process tends to cause various problems such as the channeling phenomenon of implanted dopant ions, base thickness fluctuation due to acceleration energy lowering, base region damage due to implanted dopant ions, thereby resulting in a limit for making the base region thinner. Then, conventionally, an epitaxial growth process has been employed for base region formation in place of the ion-implantation process. The bipolar transistor thus fabricated has been termed a "self-alignment type" bipolar transistor, because an emitter region is formed in self-alignment to a base region.

With the epitaxial growth process, the thickness and doping concentration can be accurately controlled and therefore, an extremely thin base region or layer can be realized together with an optimized doping concentration.

FIG. 1 shows a conventional semiconductor device with a bipolar transistor of this sort, which was disclosed in the Japanese Non-Examined Patent Publication No. 4-330730 published in November 1992. This conventional transistor was developed by the inventor, F. Sato, and other researchers.

As shown in FIG. 1, an $n^{++}$-type buried layer 52 is selectively formed in the surface area of a $p^-$-single-crystal silicon substrate 51. The substrate 51 has a resistivity of 10 to 15 $\Omega \cdot$cm. The layer 52 is heavily doped with arsenic (As).

An n-type single-crystal silicon epitaxial layer 53, which has a thickness of 1.0 μm and a doping concentration of approximately $5 \times 10^{15}$ atoms/cm$^3$, is formed to cover the buried layer 52. The epitaxial layer 53 is laterally divided into a plurality of sections or islands by a patterned isolation oxide 54 of silicon dioxide (SiO$_2$), thereby defining active regions on the substrate 51. For the sake of simplification of description, only one of the islands or active regions corresponding to the buried layer 52 is shown here.

The island or active region is divided into two parts by a part 54a of the isolation oxide 54. The left hand-side part of the island serves as a collector region of the bipolar transistor and the right hand-side part thereof serves as an $n^+$-type collector connection region 55 after a doping process of phosphorus (P).

The isolation oxide 54 is produced by using a known selective oxidation technique (for example, the LOCal Oxidation of Silicon (LOCOS) technique). The bottom of the isolation oxide 54 reaches the substrate 51.

The $p^-$-type substrate 51, the $n^+$-type buried layer 52, the n-type remaining epitaxial layer 53, the isolation oxide 54 and the $n^+$-type collector connection region 55 constitute a silicon substructure 200.

A patterned silicon nitride (Si$_3$N$_4$) film 56 is formed on the surface of the substructure 200. The film 56 has an emitter/base opening 201 exposing the remaining epitaxial layer 53 and a collector opening 202 exposing the collector connection region 55.

It is preferred that a thin silicon dioxide film is additionally provided between the surface of the substructure 200 and the silicon nitride film 56.

A $p^{++}$-type polysilicon film 57 serving as a base contact and an $n^{++}$-type polysilicon film 58 serving as a collector contact are selectively formed on the silicon nitride film 56. The $p^{++}$-type polysilicon film 57 covers the emitter/base opening 201 and has an opening 203 formed right over the opening 201. The film 57 laterally overhangs the emitter/base opening 201.

In the emitter/base opening 201, a $p^+$-type single-crystal epitaxial layer 60 serving as a base region is selectively formed on the exposed epitaxial layer 53. A $p^+$-type polysilicon film 61 serving as a base connection region is selectively formed on the epitaxial layer (i.e., base region) 60 under the overhanging part of the $p^{++}$-type polysilicon film 57. The epitaxial layer 60 and the polysilicon film 61 are contacted with each other. The polysilicon films 61 and 57 are contacted with each other.

The $n^{++}$-type polysilicon film 58 serving as the collector contact is contacted with the underlying collector connection region 54 through the collector opening 202.

A patterned silicon dioxide film 59 is formed on the polysilicon films 57 and 58 and the exposed silicon nitride film 56. The film 59 covers the inner side face of the film 57 in the emitter/base opening 201 of the film 56, and has three openings located over the emitter region 63, the base contact 57, and the collector contact 57, respectively.

In the base/emitter openings 201 and 203, an n-type single-crystal silicon layer 63 serving as an emitter region is formed on the $p^+$-type base region 60. An insulating sidewall 62 made of silicon dioxide is formed between the emitter region 63 and the base connection region 61. The sidewall 62 surrounds the emitter region 63.

An emitter electrode 64a made of aluminum is formed on the silicon dioxide film 59 to be contacted with the emitter region 63 through the corresponding opening of the film 59.

A base electrode 64b made of aluminum is formed on the silicon dioxide film 59 to be contacted with the $p^{++}$-type polysilicon base contact 57 through the corresponding opening of the film 59.

A collector electrode 64c made of aluminum is formed on the silicon dioxide film 59 to be contacted with the $n^{++}$-type polysilicon collector contact 58 through the corresponding opening of the film 59.

With the conventional semiconductor device of FIG. 1, since the base region 60 is formed by an epitaxial growth process of a single-crystal silicon, the following advantages are obtained compared with the case where the base region 60 is formed by an ion-implantation process.

(i) The thickness of the base region 60 can be made smaller.

(ii) The concentration and profile of the dopant in the base region 60 can be controlled more accurately.

Further, the emitter region 63 can be formed in self-alignment to the emitter/base opening 201 and therefore, the plan size of the base region 60 can be reduced, thereby realizing a bipolar transistor capable of high-speed operation.

Next, the fabrication method of the conventional semiconductor device of FIG. 1 is explained below referring to FIGS. 2A and 2B.

First, the silicon substructure 200 including the single-crystal silicon substrate 51, buried layer 52, epitaxial layer 53 and isolation oxide 54 is produced by using known conventional processes such as ion-implantation, epitaxial growth, and selective oxidation processes.

Next, the silicon nitride film 56 is deposited on the surface of the substructure 200 by a CVD process, and is patterned to have the collector opening 202. A polysilicon film is then deposited on the silicon nitride film 56 by a CVD process, and is patterned. A part of the patterned polysilicon film is doped with phosphorus (P) to produce the $n^{++}$-type polysilicon collector contact 58. The remaining part of the patterned polysilicon film is doped with boron (B) to produce the $p^{++}$-type polysilicon base contact 57.

After forming the opening in the base contact 57 at a location right over the emitter/base opening 201, the silicon dioxide film 57 is formed to cover the polysilicon contacts 57 and 58 over the entire substrate 51. The film 57 covers not only the top faces of the contacts 57 and 58 but also the side faces thereof. Thus, an opening 203 is formed in the contact 57.

Following this, using the silicon dioxide film 59 as a mask, the silicon nitride film 56 is removed by a wet etching process to thereby form the base opening 201, as shown in FIG. 2A. At this stage, the edge of the $p^{30+}$-type polysilicon contact 57 overhangs the opening 201.

Next, the $p^{30}$-type single-crystal silicon base region 60 is selectively and epitaxially grown on the exposed n-type epitaxial layer 53 in the opening 201 by a gas-source Molecular-Beam Epitaxy (MBE), Ultra-High-Vacuum Chemical Vapor Deposition (UHV/CVD), Low-Pressure CVD (LPCVD) process, or the like. During this epitaxial growth process, the base region 60 grows upwardly from the exposed top face of the epitaxial layer 53 and at the same time, the $p^+$-type polysilicon base contact 61 grows downward from the exposed bottom face of the base contact 57. Finally, the base region 60 and the base contact 61 are contacted with each other, thereby electrically connecting the base region 60 to the base contact 61 and the base connection region 57. The state at this stage is shown in FIG. 2B.

Further, a silicon dioxide film is deposited to cover the entire substrate 51. This silicon dioxide film fills the unfilled base/emitter openings 201 and 203. This film is then etched back to thereby form the insulating sidewall 62 an opening surrounded by the sidewall 62.

Then, the n-type single-crystal silicon emitter region 63 is selectively and epitaxially grown on the base region 60 in the opening surrounded by the sidwall 62 by an MBE, UHV/CVD, or LPCVD process.

Finally, the silicon dioxide film 59 is selectively removed and then, an aluminum film is formed to cover the remaining film 59 and is patterned. Thus, the emitter, base and collector electrodes 64a, 64b and 64c are formed as shown in FIG. 1.

Thus, the semiconductor device as shown in FIG. 1 is finished.

Other conventional semiconductor devices in which the base region is formed by an epitaxial growth process are disclosed in the Japanese Non-Examined Patent Publication Nos. 4-188716 published in July, 1992 and 5-160142 published in June, 1993.

In the Japanese Non-Examined Patent Publication No. 4-188716, a single-crystal substrate is covered with an amorphous insulating film and then, an opening is formed in the amorphous insulating film. A single-crystal layer is then hetero-epitaxially grown on the substrate in the opening. Thus, the single-crystal layer is epitaxially grown with crystal strains while restraining misfit dislocations from occurring.

In the Japanese Non-Examined Patent Publication No. 5-160142, antimony (Sb) or gallium (Ga) atoms are attached onto the surface of a SiGe mixed crystal (or alloy) layer with the single-crystal structure. Then, a Si or SiC film is deposited on the SiGe layer. Thus, crystal segregation of Ge is prevented from occurring on the SiGe layer.

Generally, when an epitaxial growth process is performed on a growth surface such as an epitaxial layer, the growth rate of an epitaxial layer varies or fluctuates with positions on the growth surface. Therefore, it is difficult to grow uniformly at any position on the entire growth surface. This means that the thickness of the epitaxial layer thus grown fluctuates with positions on the growth surface.

The growth rate fluctuation is caused by the fluctuation in the flow rate of a source gas or gasses and in temperature of the growth surface. If the epitaxial growth process performed in a high vacuum atmosphere such as MBE or UHV/CVD is employed, the flow rate fluctuation can be reduced to a considerably small value. However, the temperature fluctuation is not reduced and remains unchanged. The growth rate and the doped impurity concentration increase with the rising temperature, because the decomposition efficiency of the source and dopant gasses rises.

With the conventional fabrication method as shown in FIGS. 2A and 2B, the thickness fluctuation of the $p^+$-type base region 60 produced by a selective epitaxial growth process within the entire substrate 51 is determined by its growth rate fluctuation. This means that is a plurality of the conventional semiconductor devices are fabricated on the same substructure or wafer, the base regions of the individual devices will have different thickness. Such the different thickness causes fluctuation in the bipolar transistor characteristics such as the current gain factor $h_{FE}$ and the breakdown voltage $BV_{CEO}$.

The reason for the characteristic fluctuation is explained by the fluctuation in the base Gummel number. The base Gummel number is defined by the following expression as $$Q_B = \int_0^{W_B} N_B(x) dx$$

where $Q_E$ is the total amount of the impurity doped into the base region, $W_B$ is the width of the base region, and $N_B(x)$ is the impurity distribution in the base region. This is disclosed in detail in Proceedings of the IRE entitled "Measurement of the Number of Impurities in the Base Layer of a Transistor", pp 834, 1961.

With the above conventional fabrication method, both of the thickness and the impurity concentration of the epitaxially grown base layer 60 become high, increasing the fluctuation in the base Gummel number. For example, for a cold wall operated UHV/CVD process, the temperature fluctuation is ±1.6° C., the base layer thickness fluctuation is ±5%, and the impurity concentration fluctuation is ±1.6%, and therefore, the base Gummel number fluctuation is ±6.6%.

The collector current $I_c$ is inversely proportional to the value of the base Gummel number, i.e., $I_c \propto (1/Q_E)$. This relationship can be obtained theoretically. Thus, the following relationship is established.

$h_{FE} \propto I_c \propto (1/Q_B)$

As a result, it is seen that the base region thickness and the impurity concentration need to be reduced in order to restrain the $h_{FE}$ fluctuation.

Additionally, the following relationship regarding the breakdown voltage $BV_{CEO}$ is established, which was experimentally and theoretically obtained.

$$BV_{CEO} = \frac{BV_{CBO}}{\sqrt[n]{h_{FE}}}$$

where $BV_{CEO}$ is the open-base collector-emitter breakdown voltage, $BV_{CBO}$ is the open-emitter collector-base breakdown voltage, and the value of n is in the range from 3 to 4.

It is seen from this relationship that the $h_{FE}$ fluctuation affects the breakdown voltages $BV_{CEO}$ and $BV_{CBO}$.

SUMMARY OF THE INVENTION

The present invention was created in consideration with the above problems.

An object of the present invention is to provide a fabrication method of a semiconductor device in which a single-crystal semiconductor layer can be epitaxially grown on an entire growth surface with less or no thickness fluctuation even if the growth rate fluctuates with positions on the growth surface.

Another object of the present the invention is to provide a fabrication method of a semiconductor device in which the characteristics of bipolar transistors fabricated on the same substructure can be restrained from fluctuating.

The above objects together with others not specifically mentioned will become clear to those skilled in the art from the following description.

A fabrication method of a semiconductor device according to the present invention including the following steps.

(a) A first insulating film is formed on a first single-crystal semiconductor layer (which may serve as a collector region) of a first conductivity type.

(b) A first polycrystalline semiconductor film and a second insulating film are selectively formed on the first insulating film, respectively. The first insulating film is exposed through a first opening formed between the opposing ends of the first polycrystalline semiconductor film and the second insulating film.

(c) The first insulating film is selectively removed using the first polycrystalline semiconductor film and the second insulating film as a mask, thereby forming a second opening greater in plan size than the first opening.

(d) A second single-crystal semiconductor layer (which may serve as a base region) of the second conductivity type is epitaxially grown on the first single-crystal semiconductor layer in the second opening. The thickness of the second single-crystal semiconductor layer is defined by the height of the second opening, i.e., the thickness of the first insulating film.

(e) The second insulating film is then removed to expose a part of the second single-crystal semiconductor layer.

(f) A third single-crystal semiconductor layer of the first conductivity type is formed in or on the exposed part of the second single-crystal semiconductor layer to thereby produce a p-n junction therebetween.

With the fabrication method according to the present invention, the thickness of second single-crystal semiconductor layer (the base region) is defined by the thickness of the first insulating film.

The first insulating film may be formed by a CVD process or the like that enables to realize a smaller thickness fluctuation than that of a single-crystal film obtained by a selective epitaxial growth process. Therefore, the second single-crystal semiconductor layer can be produced with a smaller thickness fluctuation.

As a result, even if the temperature of the underlying first single-crystal semiconductor layer varies with position on its surface during the epitaxial growth process for the second single-crystal semiconductor layer, (in other words, the growth rate of the second single-crystal semiconductor layer fluctuates,) the thickness fluctuation of the second single-crystal semiconductor layer can be kept at a satisfactorily low value.

Also, even if the first insulating film has a considerably large fluctuation, the possibility that the doping concentration of the first insulating film becomes relatively high at a position where the thickness is relatively large is low. Accordingly, the variation or fluctuation of the base Gummel number with positions on the surface of the first single-crystal semiconductor layer can be restrained to a satisfactorily low value. This leads to restriction in characteristics of bipolar transistors fabricated on the same substructure.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
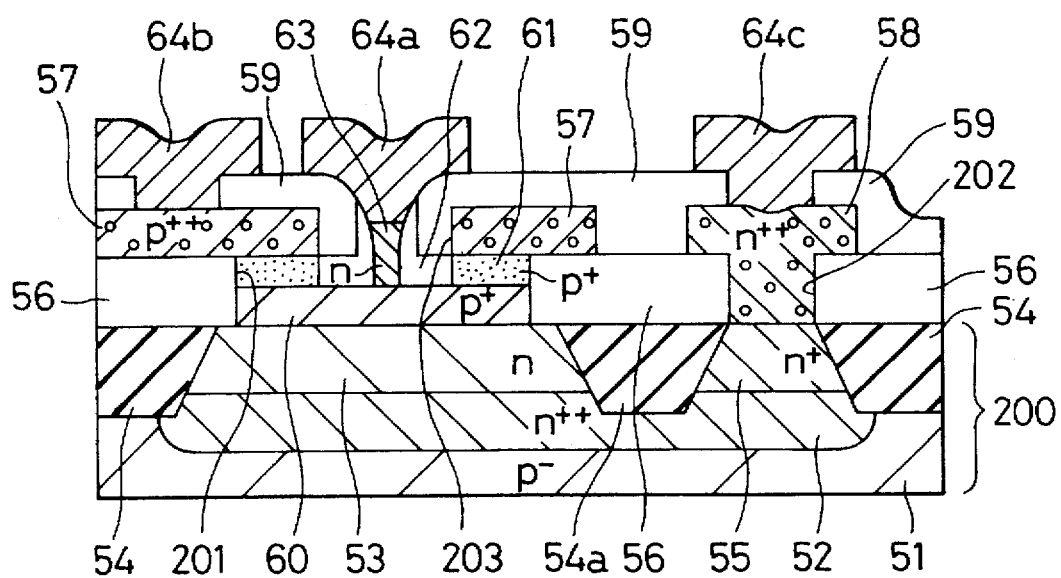
FIG. 1 is a partial cross-sectional view showing a semiconductor device fabricated by a conventional method.
Figure 2A:
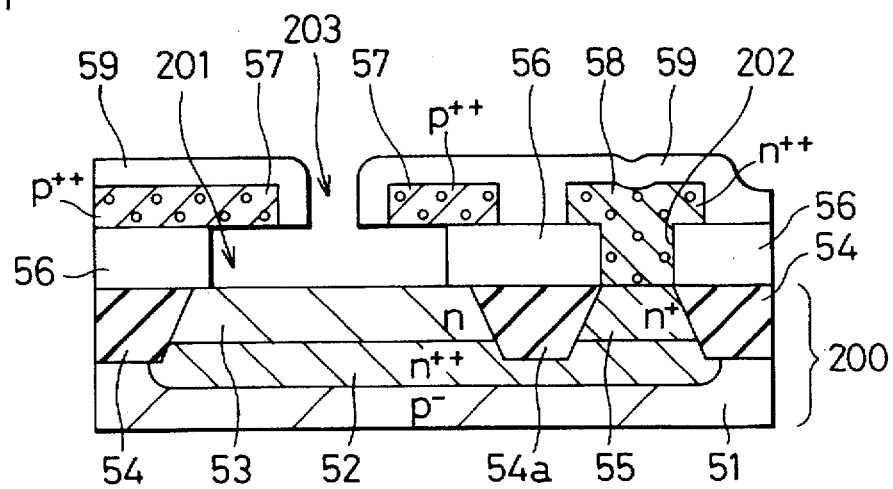
FIGS. 2A and 2B are partial cross-sectional views showing the conventional fabrication method of the semiconductor device of FIG. 1, respectively.
Figure 2B:
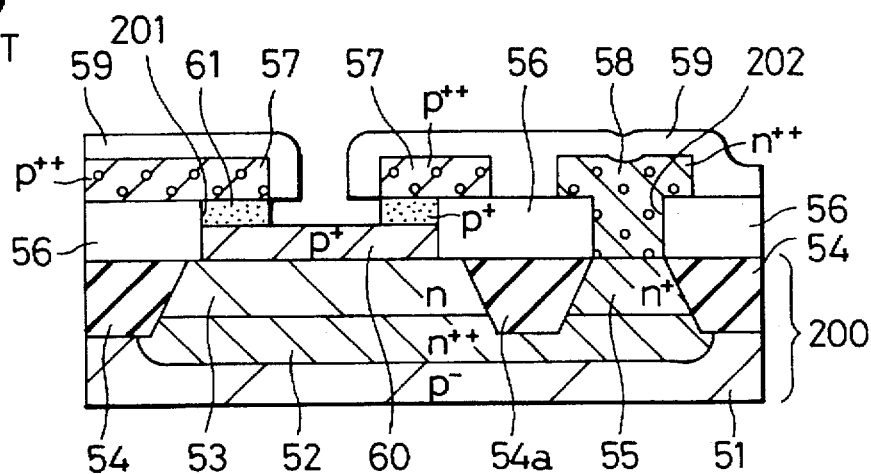

Preferred embodiments of the present invention will be described in detail below while referring to the drawings attached.

FIRST EMBODIMENT

Figure 3:
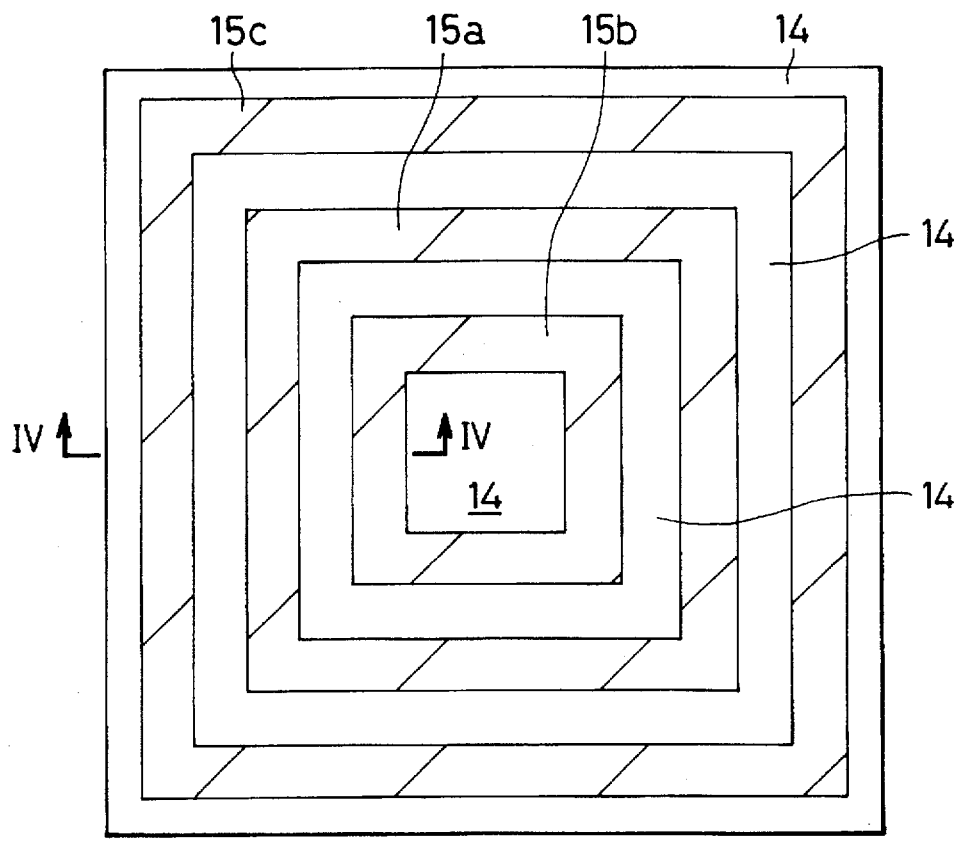
FIG. 3 is a partial plan view showing a semiconductor device fabricated by a method according to a first embodiment of the invention.
Figure 4:
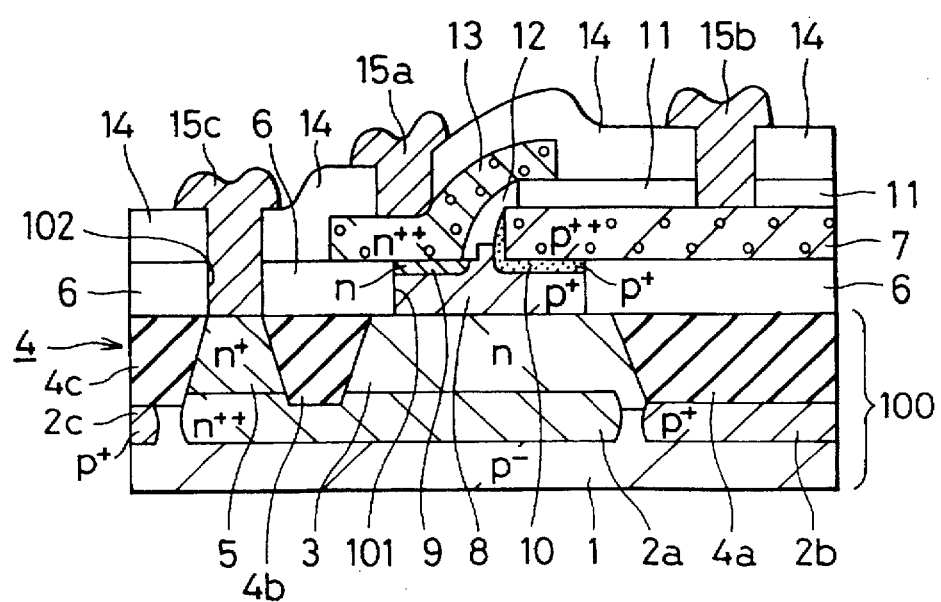
FIG. 4 is a partial cross-sectional view along the line IV—IV in FIG. 3.

FIGS. 3 and 4 show a semiconductor device fabricated by a method according to a first embodiment of the invention. In this embodiment, the device contains bipolar transistors with the "walled emitter structure".

As shown in FIGS. 3 and 4, an $n^{++}$-type buried layer $2a$ serving as a sub-collector region and $p^+$-type buried layers $2b$ and $2c$ serving as channel stop regions are formed in the surface area of a $p^-$-single-crystal silicon substrate 1. The substrate 1 has a resistivity of 10 to 15 $\Omega\cdot$cm.

An n-type single-crystal silicon epitaxial layer 3 is formed to cover the buried layers $2a$, $2b$ and $2c$. The epitaxial layer 3 is laterally divided into a plurality of sections or islands by a patterned isolation oxide 4 of silicon dioxide, thereby defining active regions on the substrate 1. For the sake of simplification of description, only one of the islands or active regions is shown here.

The isolation oxide 4 includes an inner part $4a$, a middle part $4b$ and an outer part $4c$. The inner and middle parts $4a$ and $4b$ form an emitter/base window with an approximately square-ringed shape therebetween. The middle and outer parts $4b$ and $4c$ form a collector window with an approximately square-ringed shape therebetween.

The n-type epitaxial layer 3 existing between the inner and middle parts $4a$ and $4b$, which is exposed from the emitter/base window, serves as a collector region. The n-type epitaxial layer 3 existing between the middle and outer parts $4b$ and $4c$, which is exposed from the collector window, is further doped with an n-type impurity, thereby serving as an $n^+$-type collector connection region 5. The inner part $4a$ has a square plan shape.

The isolation oxide 4 is produced by a known selective oxidation technique (for example, the LOCOS technique). The bottom of the isolation oxide 4 reaches the substrate 1.

The $p^-$-type substrate 1, the $n^{++}$-type buried layer $2a$, the $p^+$-type buried layers $2b$ and $2c$, the n-type remaining epitaxial layer 3, the isolation oxide 4 and the $n^+$-type collector connection region 5 constitute a silicon substructure 100.

A silicon nitride ($Si_3N_4$) film 6 is formed on the surface of the substructure 100. The film 6 has an emitter/base opening 101 over the emitter/base window and a collector opening 102 over the collector window.

In the emitter/base opening 101, a $p^+$-type single-crystal silicon epitaxial layer 8 is formed on the n-type single-crystal silicon epitaxial layer 3 by a selective growth technique. The epitaxial layer 8 serves as a base region. An n-type single-crystal silicon film 9 serving as an emitter region is selectively formed on the base region 8.

A $p^{++}$-type polysilicon film 7 serving as a base contact is selectively formed on the silicon nitride film 6 over the inner part $4a$ of the isolation oxide 4. The film 7 overhangs the emitter/base opening 101. The bottom and side faces of the overhanged end of the film 7 are covered with a $p^+$-type polysilicon film 10. The film 10 is contacted with the $p^+$-type base region 8. The film 7 is covered with a silicon dioxide film 11.

An $n^{++}$-type polysilicon film 13 serving as an emitter contact is selectively formed on the emitter region 9 and the silicon nitride film 6. A silicon dioxide sidewall 12 is formed on the $p^+$-type base region 8 between the polysilicon film 13 and the opposing polysilicon film 10. The film 13 serves as a diffusion source of an n-type impurity on the formation of the emitter region 9.

A silicon dioxide film 14 having contact holes is formed to cover the entire underlying structure. An emitter electrode $15a$ is formed on the film 14 to be contacted with the underlying emitter contact 13 made of $n^{++}$-type polysilicon through a corresponding one of the contact holes of the film 14. A base electrode $15b$ is formed on the film 14 to be contacted with the underlying base contact 7 made of $p^+$-type polysilicon through a corresponding one of the contact holes of the film 14. A collector electrode $15c$ is formed on the film 14 to be contacted with the underlying collector connection region 5 made of $n^+$-type single-crystal silicon through a corresponding one of the contact holes of the film 14 and a contact hole of the silicon nitride film 6. The emitter, base and collector electrodes $15a$, $15b$ and $15c$ are made of aluminum (Al).

Next, a fabrication method of the semiconductor device shown in FIGS. 3 and 4 is explained below referring to FIGS. 5A to 5I.

With this fabrication method, the silicon substructure 100 can be produced by conventional process steps and the feature of the invention relates to the formation of the base region 8. Therefore, the description regarding the formation of the substructure 100 is omitted here for the sake of simplification.

First, the silicon substructure 100 as shown in FIGS. 3 and 4 is prepared. The epitaxial layer 3 has a thickness of approximately 0.7 μm and a doping concentration of $1\times10^{16}$ atoms/cm$^3$. The n-type dopant for the layer 3 is phosphorus (P).

Next, the silicon nitride film 6 with a thickness of approximately 1000 Å is formed on the surface of the substructure 100 by a Low-Pressure Chemical Vapor Deposition (LPCVD) process under the condition that the substrate temperature is set as 650° to 750° C. and that $SiCl_2H_2$ and $NH_3$ are supplied to a reaction chamber and are chemically reacted with each other in a pressure-reduced atmosphere (e.g., several Torricellis (Torr)).

The thickness of the film 6 is equal to the sum of the thicknesses of the base region 8 and the emitter region 9. Therefore, the thickness of the film 6 is preferably set as a value in the range from 500 Å to 2000 Å.

The $p^{++}$-type polysilicon film 7 having a thickness of approximately 2000 Å is formed on the silicon nitride film 6. The film 7 is doped with boron (B) the dose of which is $1\times10^{16}$ atoms/cm$^2$. Since this film 7 serves as the base contact, it is preferred that the thickness is in the range from 1500 to 3000 Å and that the dose of boron is in the range from $5\times10^{15}$ to $2\times10^{16}$ atoms/cm$^2$.

Figure 5A:
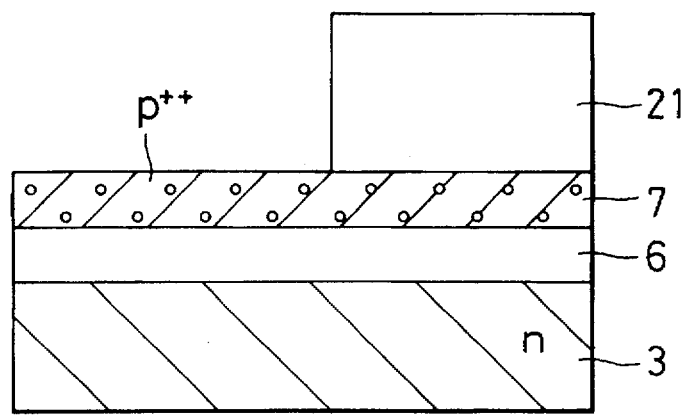
FIGS. 5A to 5I are partial cross-sectional views showing the fabrication method according to the first embodiment of the invention, respectively.

Subsequently, as shown in FIG. 5A, a silicon dioxide film 21 with a thickness of approximately 5000 Å is deposited on the polysilicon film 7 by a CVD process. The film 21 is then patterned to be divided into islands by photolithography and etching techniques. It is preferred that the thickness of the film 21 is greater than twice the thickness of the polysilicon film 7, because the film 21 needs to be left partially on the film 7 during the subsequent etching process of the silicon dioxide film 23.

Figure 5B:
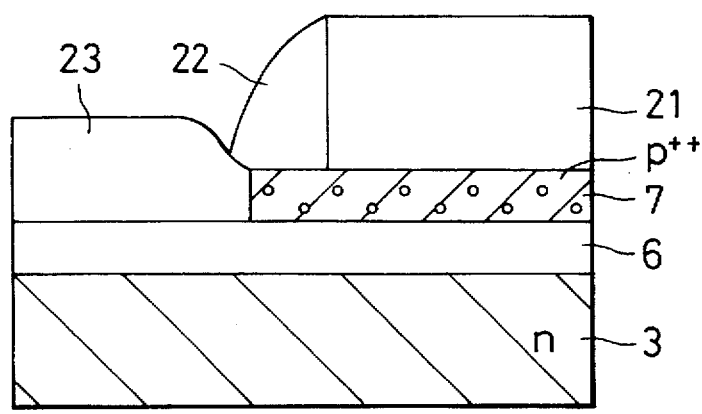

A silicon nitride film (not shown) is deposited to cover the silicon dioxide film 21 and the exposed polysilicon film 7. The silicon nitride film is then etched back to thereby form an insulating sidewall 22 made of the remaining silicon nitride film on the film 7, as shown in FIG. 5B. The sidewall 22 is contacted with the side face of the silicon dioxide film 21. In other words, the sidewall 22 covers to surround the side face of the film 21.

The exposed part of the polysilicon film 7 is oxidized to form a silicon dioxide film 23, as shown in FIG. 5B. The thickness of the film 23 is equal to approximately twice the thickness of the polysilicon film 7. During this oxidation process, a bird's beak (not shown) of the film 23 is extended to a position just below the sidewall 22; in other words, the inner end of the film 23 is covered with the sidewall 22. The length of the bird's beak can be kept at less than approximately 0.1 μm if the oxidation condition is selected. Additionally, the surface area of the unexposed polysilicon film 7, which is covered with the silicon dioxide film 21, is also oxidized slightly during this process. However, such the oxidized area is not shown in FIG. 5B.

Figure 5C:
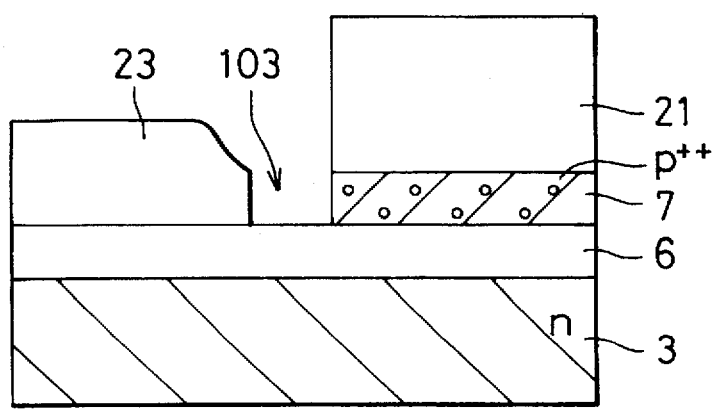

The sidewall 22 made of silicon nitride is selectively removed by a wet etching process using a heated phosphoric acid ($H_3PO_4$) solution. Then, the polysilicon film 7 is selectively removed by an anisotropical etching process using the silicon dioxide films 21 and 23 as a mask, thereby forming an opening 103 at the boundary of the films 21 and 23, as shown in FIG. 5C. The opening 103 has a square-ringed plan shape surrounding the inner part 4a of the isolation oxide 4.

Figure 5D:
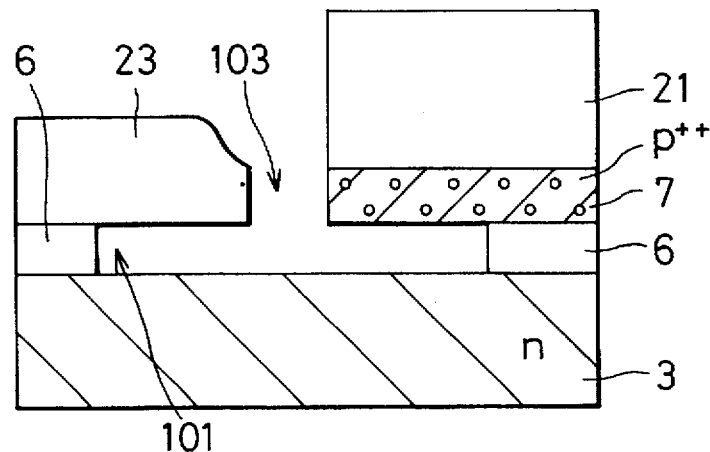

Then, using the silicon dioxide films 21 and 23 as a mask, the underlying silicon nitride film 6 is selectively removed by a wet etching process using a heated phosphoric acid solution. Thus, the opening 101 is formed on the n-type epitaxial layer 3, thereby exposing the underlying n-type epitaxial layer 3, as shown in FIG. 5D. The opening 101 is disposed just under the opening 103 and is greater in plan size or width than the opening 103. The side-etching amount of the film 6 relates to not only the area of the base region but also the area of the emitter region.

Figure 5E:
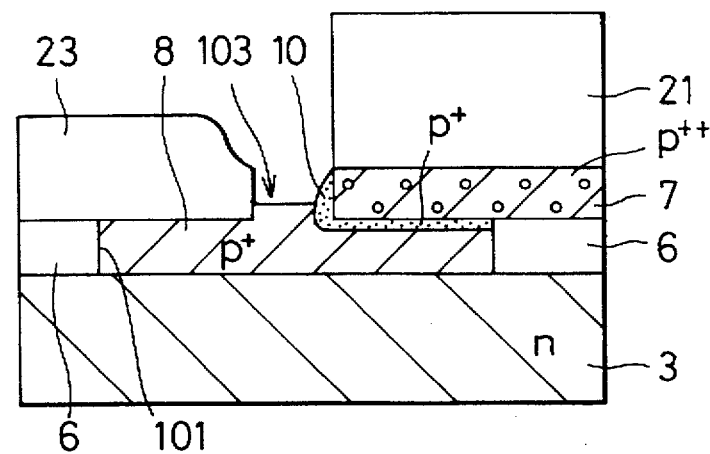

Subsequently, a $p^+$-type single-crystal silicon film 8 is selectively and epitaxially grown on the exposed epitaxial layer 3 in the opening 101. The film 8 is grown upwardly from the surface of the layer 3. This film 8, which serves as the $p^+$-type base region, is doped with boron the doping concentration of which is approximately $4 \times 10^{18}$ atoms/cm$^3$. At the same time, a $p^+$-type polysilicon film 10 is selectively and epitaxially grown on the side and bottom faces of the $p^{++}$-type single-crystal silicon film 7. The film 10 is grown downward from the bottom face of the film 7 and laterally from the side face thereof. The grown films 10 and 7 are finally contacted with each other, in other words, the base region 8 and the base contact 7 are electrically connected to each other. Thus, the opening 101 is filled with the $p^+$-type single-crystal silicon film 8 and the $p^+$-type polysilicon film 10. The state at this stage is shown in FIG. 5E.

During this crystal growth process, no film is grown on the insulator films such as the silicon dioxide films 21 and 23 and the silicon nitride film 6. Therefore, the crystal growth of the single-crystal silicon film 8 and the polysilicon film 10 can be termed "selective growth."

The above crystal growth process can be realized by a gas-source MBE or UHV/CVD process. For an MBE process, this growth process is performed under the condition that the substrate temperature is 560° C., the flow rate of $Si_2H_6$ as a gaseous silicon source is 70 standard cubic centimeters per minute (sccm), and the atmosphere pressure is $2 \times 10^{-5}$ Torr. This was disclosed in detail by the inventor, F. Sato, and other researchers in 1990 IEDM, pp. 607–610.

For a UHV/CVD process, this growth process is performed under the condition that the substrate temperature is 605° C., the flow rate of $Si_2H_6$ as a gaseous silicon source is 12 sccm, and the flow rate of $Cl_2$ as a reaction gas is 0.03 sccm, which was disclosed in detail by the inventor, F. Sato, and other researchers in 1992 symposium on VLSI Technology Digest of Technical Papers, pp. 62–63.

Figure 5F:
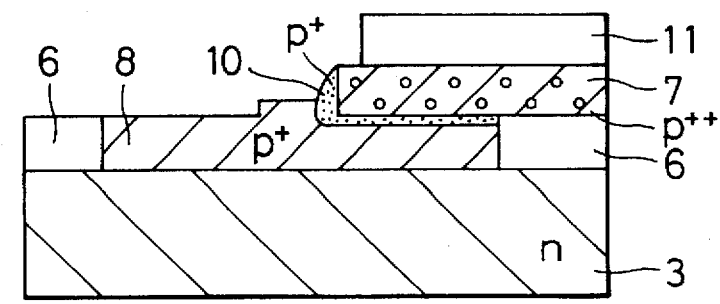

Then, the silicon dioxide films 21 and 23 are subjected to a wet etching process using a buffered hydrogen fluoride (HF) solution. During this process, the etching period is so set that the relatively thin silicon dioxide film 23 is entirely etched out and the relatively thick silicon dioxide film 21 is partially etched. The state at this state is shown in FIG. 5F. The remaining film 21 on the polysilicon film 7 is denoted by a reference numeral 11 in FIG. 5F. This film 11 is necessary for the formation of the insulating sidewall 12.

In place of this wet etching process, the following processes may be employed: First, both of the silicon dioxide films 21 and 23 are entirely etched. Next, a new silicon dioxide film is deposited to cover the polysilicon film 7. Finally, the new silicon dioxide film is patterned to be left on the film 7, as shown in FIG. 5F.

Figure 5G:
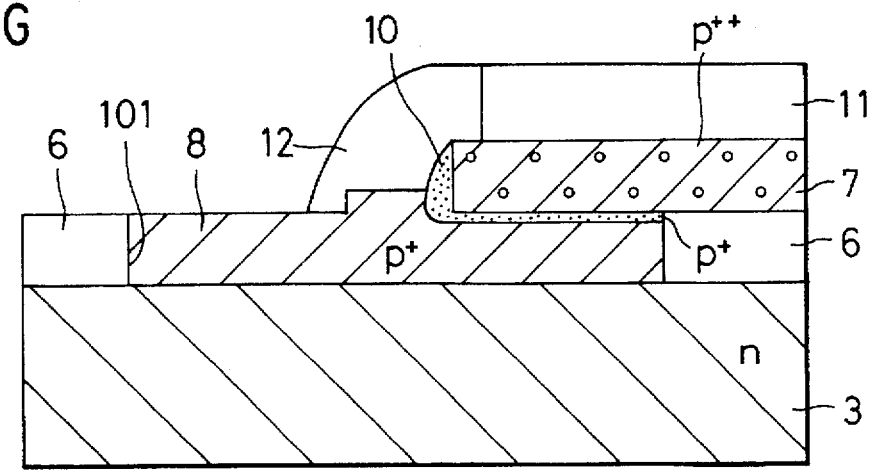

Subsequently, a silicon dioxide film (not shown) is deposited on the entire substrate 1 by a CVD process and is etched back by a dry etching process, thereby forming the silicon dioxide sidewall 12 on the polysilicon base region 8, as shown in FIG. 5G. The sidewall 12 is contacted with the side face of the silicon dioxide film 11 and the exposed surfaces of the polysilicon films 7 and 10. The sidewall 12 has a width or thickness of approximately 4000 Å.

To avoid etching damage to the base region 8, it is preferred that the base region 8 made of epitaxially grown single-crystal silicon is not exposed from the silicon dioxide film during the dry etching process and then, the region 8 is exposed therefrom by a wet etching process using a buffered hydrogen fluoride solution.

The reason for which the insulating sidewall 12 is prepared here is as follows:

(i) If the sidewall 12 is not formed, the $n^{++}$-type polysilicon film 13 used for forming the emitter region 9 will be contacted with the $p^{++}$-type polysilicon base region 7. The sidewall 12 ensures that the emitter region 9 is prevented from being contacted with the base region 8.

(ii) The emitter region 9, which will be formed by diffusion of the contained impurity in the $n^{++}$-type polysilicon film 13 in a subsequent process, tends to be adjacent to or contacted with a heavily-doped diffusion region. This diffusion region will be formed by diffusion of the impurity contained in the $p^{++}$-type polysilicon film 7 into the base region 8. Thus, the breakdown voltage of the bipolar transistor will degrade. The sidewall 12 ensures that such the breakdown voltage degradation is prevented from occurring.

(iii) If the sidewall 12 is not formed, the emitter region 9 tends to laterally expand toward the $p^{++}$-type polysilicon film 7 and as a result, a part of the region 9 may be located in the area corresponding to the opening 103 where the thickness of the base region 8 is not defined by the thickness of the silicon nitride film 6. The sidewall 12 ensures that such the expansion of the emitter region 9 is prevented from occurring.

Figure 5H:
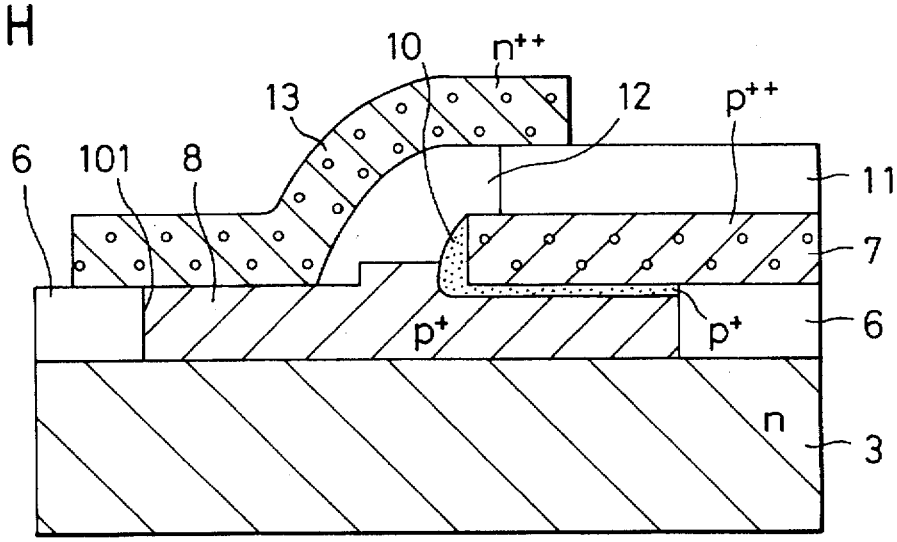

Further, a polysilicon film with a thickness of approximately 2000 Å is deposited to cover the entire substrate 1 by a CVD process. The polysilicon film is doped with arsenic (As) with a dose of approximately $1 \times 10^{16}$ atoms/cm$^2$, thereby forming the n$^{++}$-type polysilicon film 13. The polysilicon film 13 is then patterned to be a plan shape as shown in FIG. 5H. At this stage, the remaining film 13 covers the sidewall 12 and the exposed base region 8 and extends along the base region 8 with a square-ringed plan shape. The inner and outer ends of the film 13 are placed on the silicon dioxide film 11 and the silicon nitride film 6, respectively.

The impurity may be doped into the polysilicon film during the film formation process (i.e., the CVD process).

Figure 5I:
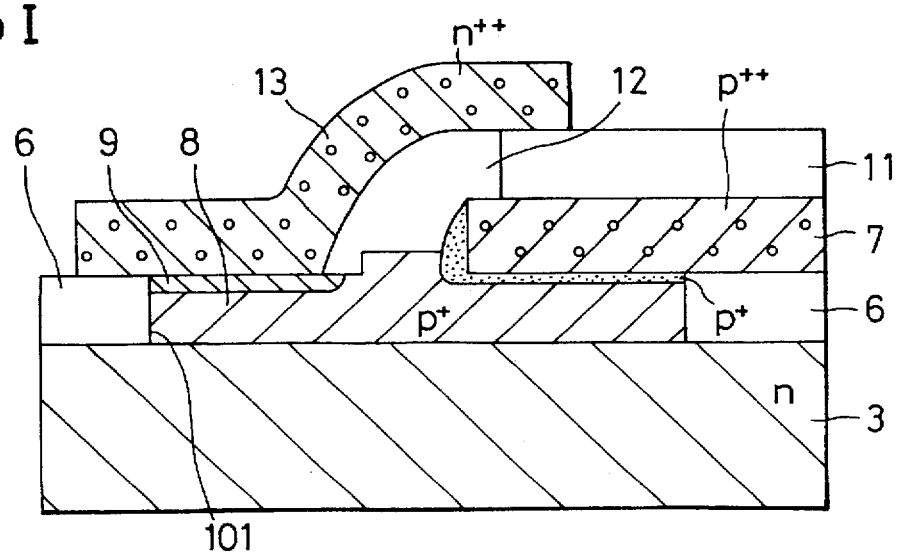

The n$^{++}$-type patterned polysilicon film 13 then heat-treated at a temperature of 975° C. for 15 seconds to diffuse the impurity contained in the film 13 into the base region 8, thereby forming the n-type emitter region 9 in the base region 8, as shown in FIG. 5I.

Following this process, the silicon dioxide film 14 is formed to cover the entire substrate 1 and is patterned to have penetrating contact holes therein.

Finally, an aluminum film is formed on the patterned silicon dioxide film 14 over the entire substrate 1, and is then patterned. Thus, the emitter electrode 15a, the base electrode 15b and the collector electrode 15c are made, as shown in FIGS. 3 and 4.

The emitter electrode 15a is contacted with the underlying emitter contact 13 made of n$^{++}$-type polysilicon through a corresponding one of the contact holes. The base electrode 15b is contacted with the underlying base contact 7 made of p$^{++}$-type polysilicon through a corresponding one of the contact holes and the penetrating hole of the silicon dioxide film 11. The collector electrode 15c is contacted with the underlying collector connection region 5 made of n$^+$-type single-crystal silicon through a corresponding one of the contact holes and the penetrating hole of the silicon nitride film 6.

Through the above-described process sequence, the semiconductor device with the bipolar transistor shown in FIGS. 3 and 4 is finished.

With the fabrication method according to the first embodiment, the opening or cavity 101 is obtained by partially etching the silicon nitride film 6 and then, the base region 8 is selectively grown in the opening 101. Therefore, the thickness of the base region 8 is defined by the thickness of the silicon nitride film 6.

The silicon nitride film 6 is obtained by a CVD process enabling a smaller thickness fluctuation than that by a selective epitaxial growth process. This means that the silicon nitride film 6 can be produced with a smaller thickness fluctuation.

As a result, even if the temperature of the underlying epitaxial layer 3 varies with position on the surface of the substrate 1, thereby fluctuating the growth rate of the base region 8, the thickness fluctuation of the base region 8 can be kept at a satisfactorily low value.

Also, even if the silicon nitride film 6 has a considerably large fluctuation, there arises a low possibility that the doping concentration of the film 6 becomes relatively high at a position where the thickness is relatively large. Accordingly, the variation or fluctuation of the base Gummel number with position on the surface of the substrate 1 can be restrained to a satisfactorily low value. This leads to restriction in characteristics fluctuation of the high-speed bipolar transistors fabricated on the same substrate 1.

SECOND EMBODIMENT

Figure 6:
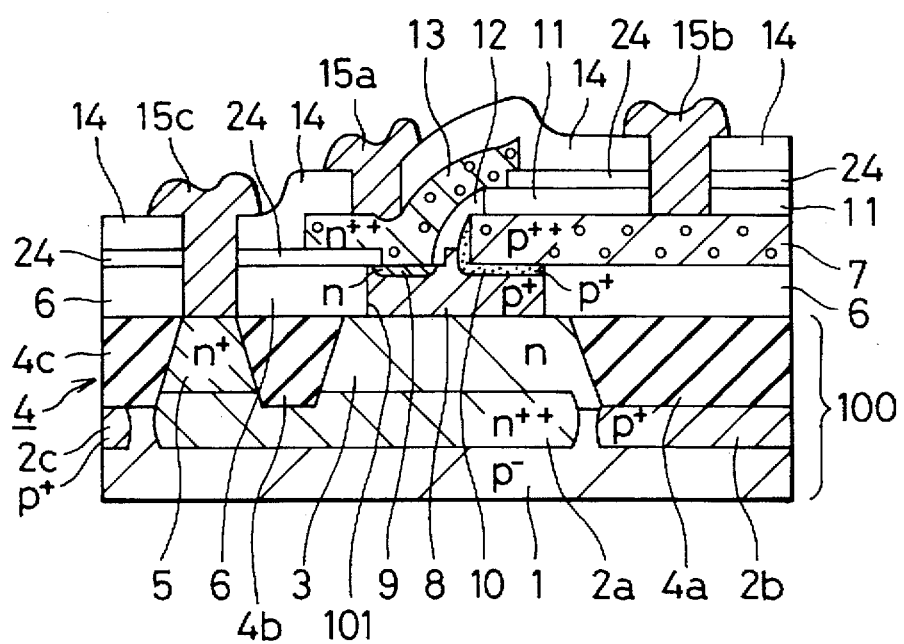
FIG. 6 is a partial cross-sectional view showing a semiconductor device fabricated by a method according to a second embodiment of the invention.

FIG. 6 shows a semiconductor device fabricated by a method according to a second embodiment of the invention, in which the bipolar transistor has a "non-walled emitter structure". Specifically, the emitter region 9 is not contacted with the silicon nitride film 6. The other structure is the same as that of the first embodiment and therefore, the description regarding the same structures is omitted here by attaching the same reference numerals to the corresponding elements for simplification.

The fabrication method according to the second embodiment includes the same process steps as those in the first embodiment except that the following two processes are added.

Figure 7A:
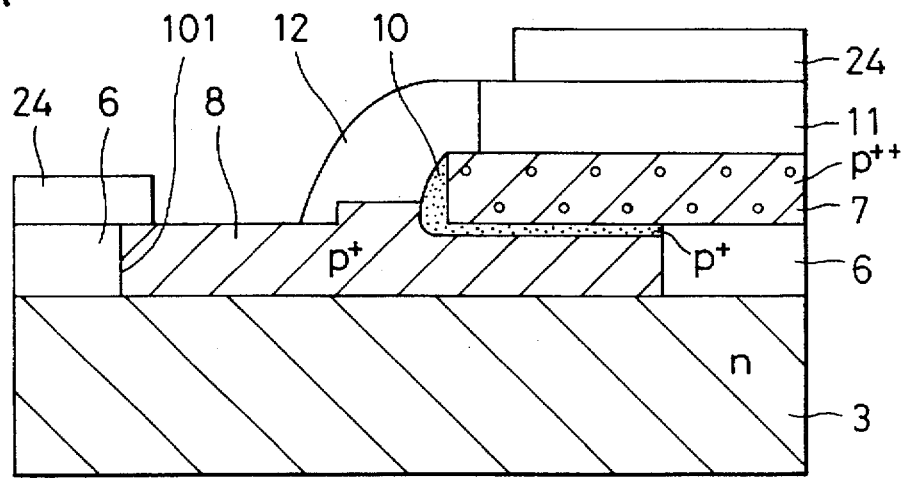
FIGS. 7A and 7B are partial cross-sectional views showing the fabrication method according to the second embodiment of the invention, respectively.

Specifically, after the state shown in FIG. 5G is obtained, a silicon dioxide film 24 is deposited by a CVD process to cover the silicon dioxide film 11, the sidewall 12, the base region 8 and the silicon nitride film 6. Next, the film 24 is patterned to be left on the films 6 and 24 by photolithography and etching techniques. As shown in FIG. 7A, the film 24 disposed on the film 6 overhangs the opening 101. In other words, the end of the film 24 is placed on the base region 8.

Figure 7B:
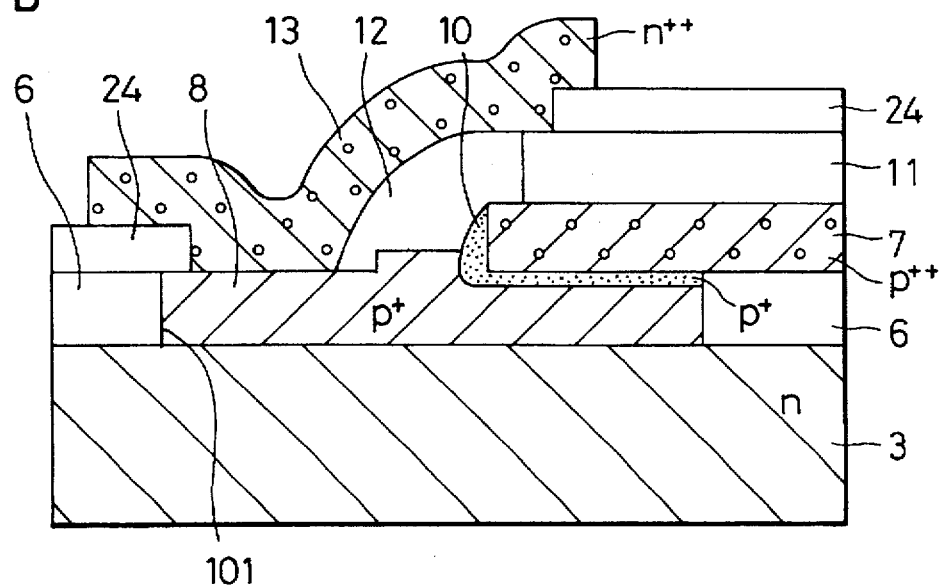

Following this process, the n$^{++}$-type polysilicon film 13 is selectively formed as shown in FIG. 7B.

The subsequent process steps are the same as those in the first embodiment. Through these process steps, the semiconductor device as shown in FIG. 6 is obtained.

The device according to the first embodiment has the following disadvantages:

Since the emitter region 9 is contacted with the silicon nitride film 6, the impurity contained in the n$^{++}$-polysilicon film 13 readily diffuse along the inner boundary of the film 6 during the formation process of the emitter region 9.

Also, an inversion layer is readily produced on the side face of the base region 8 which is contacted with the film 6.

As a result, the breakdown voltage tends to degrade. However, such the problem is prevented from occurring in the second embodiment.

THIRD EMBODIMENT

Figure 8:
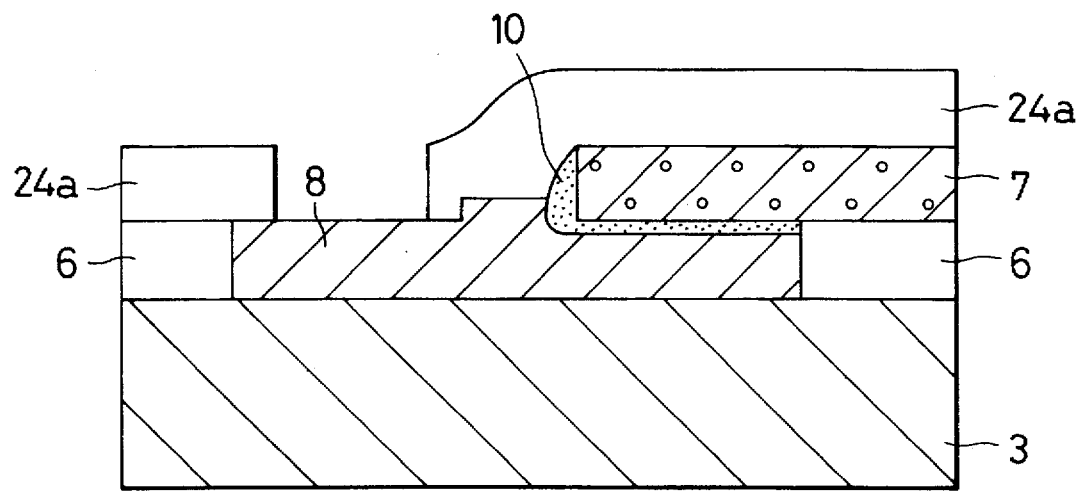
FIG. 8 is a partial cross-sectional view showing a fabrication method according to a variation of a third embodiment of the invention.
Figure 9:
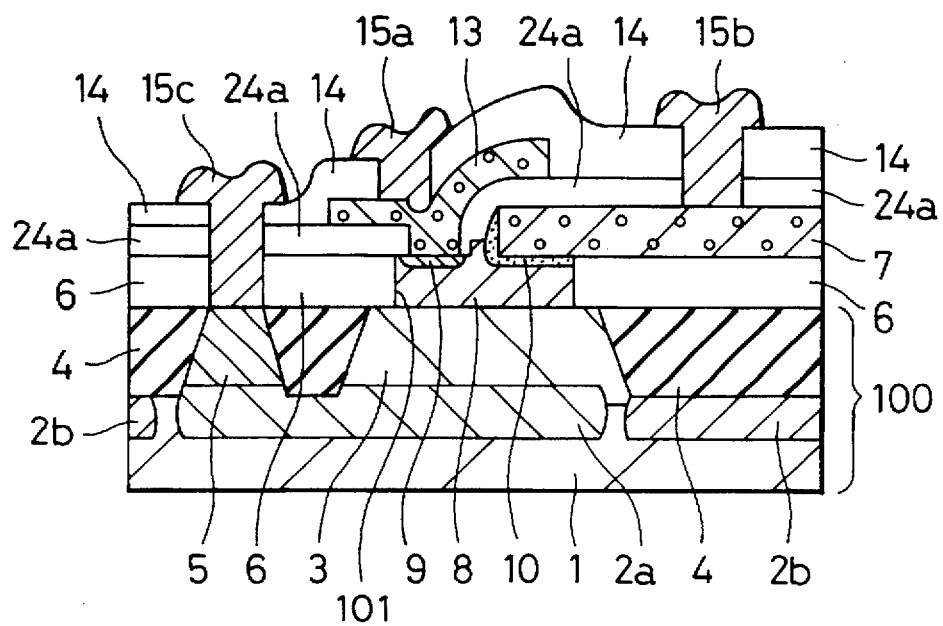
FIG. 9 is a partial cross-sectional view showing the semiconductor device fabricated by the method according to the third embodiment of the invention.

FIGS. 8 and 9 show a fabrication method according to a third embodiment of the invention, which corresponds to a variation of the second embodiment.

Specifically, in this embodiment, the formation processes of the silicon dioxide films 11 and 12 in the method of the second embodiment are omitted. Therefore, as shown in FIG. 8, a silicon dioxide film 24a is formed to cover the entire substrate 1 except for the emitter formation region.

In this embodiment, there is an additional advantage that the process step number can be reduced and the step height on the top surface of the structure can be lowered compared with the case of FIGS. 7A and 7B. The semiconductor device has a structure shown in FIG. 9, which is the same as that of the second embodiment except that the film 24a is formed instead of the films 11 and 24.

FOURTH EMBODIMENT

FIGS. 10, 11 and 12A and 12B show a fabrication method of a semiconductor device according to a fourth embodiment of the invention. Although this device has the same partial cross section as shown in FIG. 4 (see FIG. 11), the base and emitter regions of the fourth embodiment do not have such a square-ringed shape as in the first embodiment.

Figure 10:
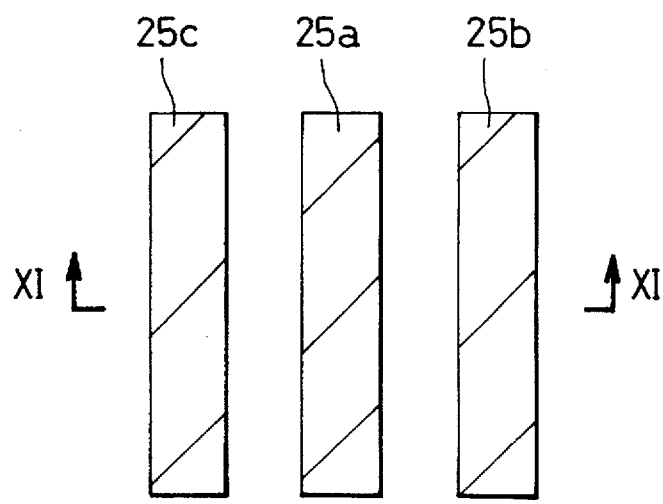
FIG. 10 is a schematic partial plan view showing a semiconductor device fabricated by a method according to a fourth embodiment of the invention.
Figure 11:
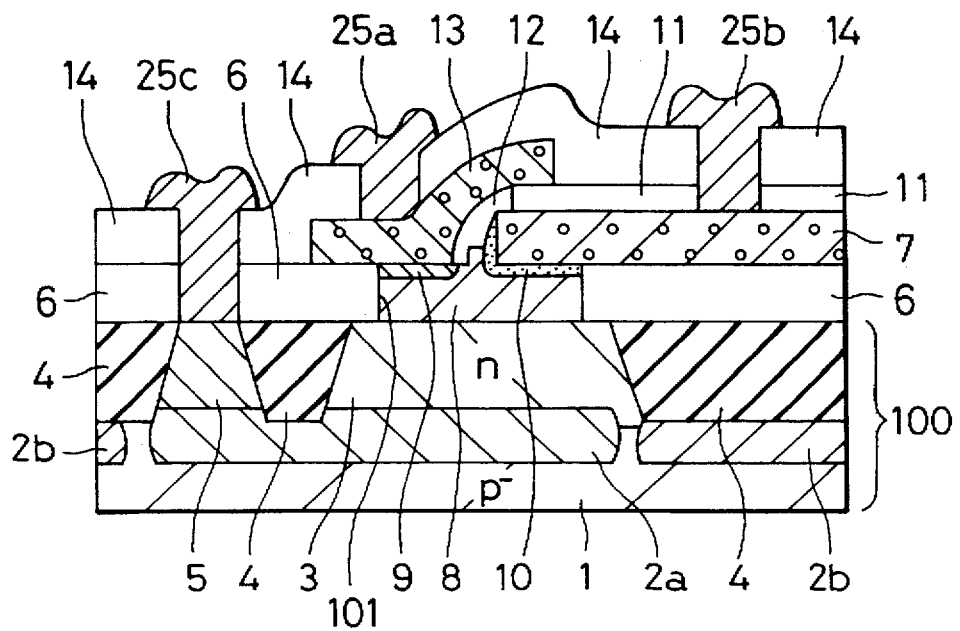
FIG. 11 is a partial cross-sectional view of the semiconductor device fabricated by the method according to the fourth embodiment of the invention.

In the semiconductor device of the fourth embodiment, as shown in FIG. 10, emitter, base and collector electrodes 25a, 25b and 25c are formed to extend linearly and in parallel.

In the method according to the fourth embodiment, there is an additional advantage that a wider layout margin can be obtained for the electrodes 25a, 25b and 25c.

Since the process steps are almost the same as those in the first embodiment, only the different processes are shown here.

Figure 12A:
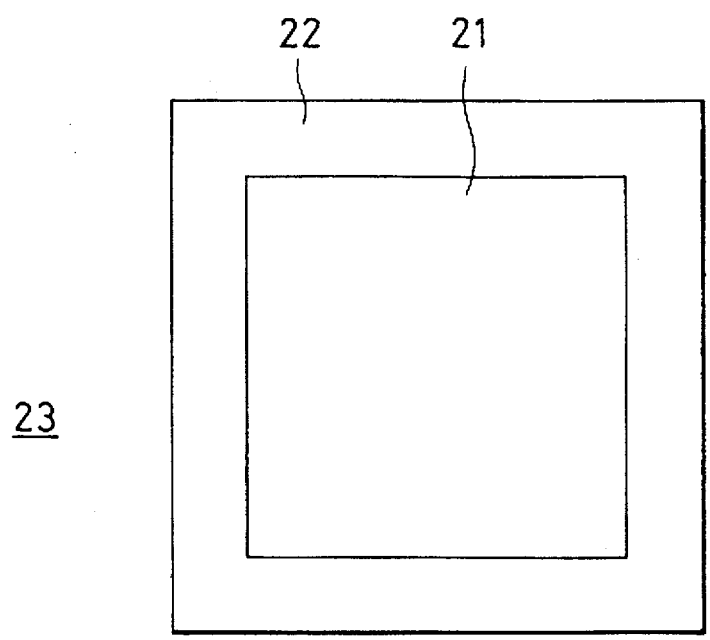
FIGS. 12A and 12B are partial plan views showing the fabrication method according to the fourth embodiment of the invention, respectively.

FIG. 12A is a partial plan view corresponding to FIG. 5B. As shown in FIG. 12A, the silicon dioxide film 21 is patterned to a square plan shape, and the silicon nitride sidewall 22 is formed to surround the film 21. The silicon dioxide film 23 exists in the area outside the film 21 and sidewall 22.

Figure 12B:
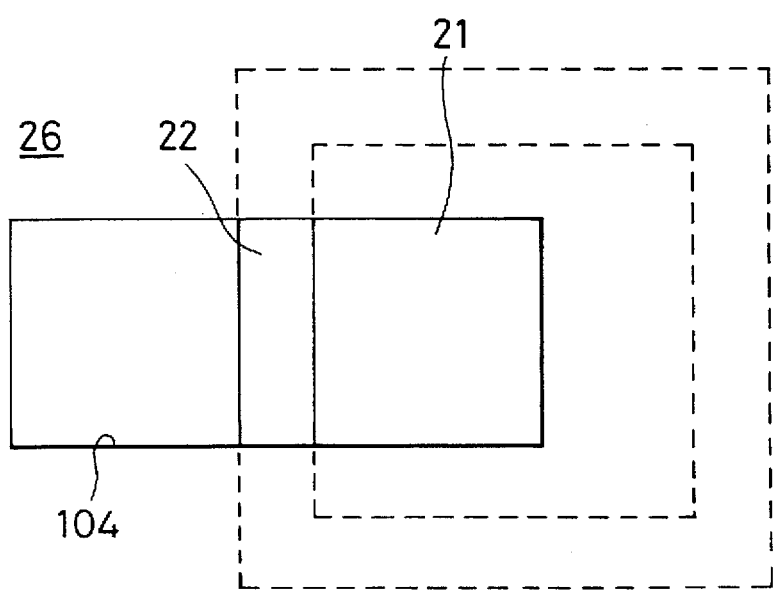

Next, a silicon dioxide film 26 is formed over the entire substrate 1 by a CVD process and then, a patterned photoresist film (not shown) having a window at a position corresponding to the opening 103 is formed on the film 26 by a typical photolithography process. Using this patterned photoresist film as a mask, the underlying silicon dioxide film 21 and the underlying sidewall 22 are selectively removed by a wet etching process using a buffered HF solution. The photoresist film is then removed. Thus, a rectangular opening 104 is produced in the silicon dioxide film 26, as shown in FIG. 12B.

Further, using the patterned silicon dioxide film 26 as a mask, the silicon nitride film 22 exposed from the film 26 in the opening 104 is selectively removed by a wet etching process using a heated phosphoric acid solution. The state at this stage is the same as that of FIG. 5C.

The subsequent process steps are the same as those in the first or second embodiment.

FIFTH EMBODIMENT

FIGS. 13A to 13D and 14 show a fabrication method of a semiconductor device according to a fifth embodiment of the invention, which corresponds to a variation of the first embodiment.

FIGS. 13A to 13D correspond to FIGS. 5C to 5D, respectively.

Figure 13A:
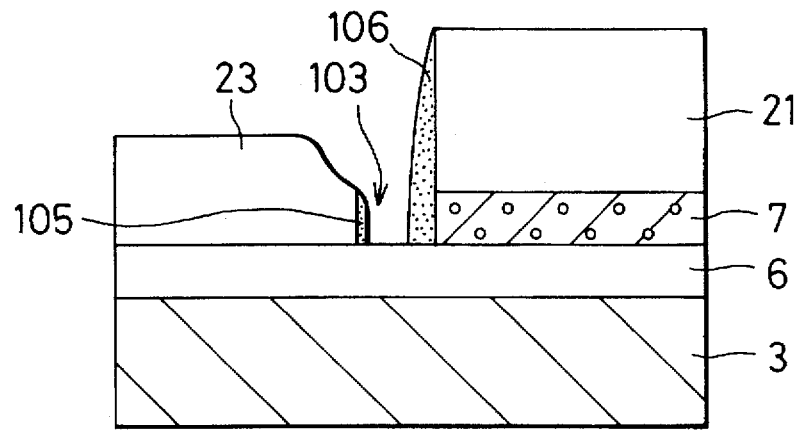
FIGS. 13A to 13D are partial cross-sectional views showing a fabrication method according to a fifth embodiment of the invention, respectively.

In the fifth embodiment, after the state or structure of FIG. 5C is produced, a silicon dioxide film (not shown) is formed by a CVD process over the entire substrate 1. Then, this film is etched back to form sidewalls 105 and 106, as shown in FIG. 13A. The sidewall 105 covers the side face of the silicon dioxide film 23. The sidewall 106 covers the side faces of the $p^{++}$-type polysilicon film 7 and the silicon dioxide film 21.

Figure 13B:
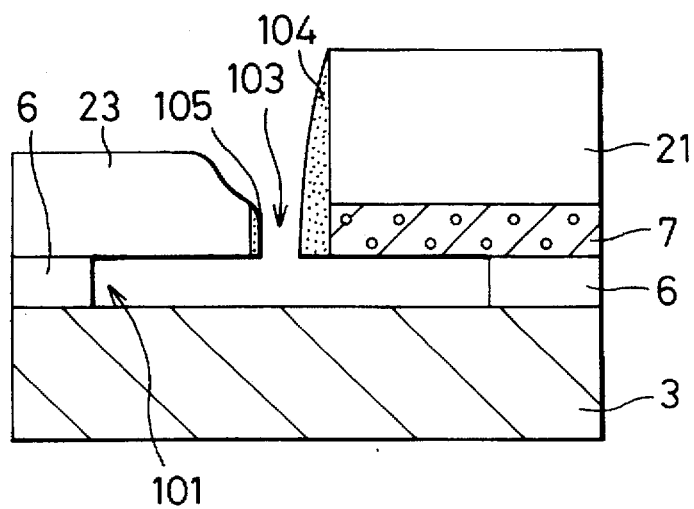

Next, the silicon nitride film 6 is selectively removed by a wet etching process through the opening 103, thereby forming the opening 101, as shown in FIG. 13B.

Figure 13C:
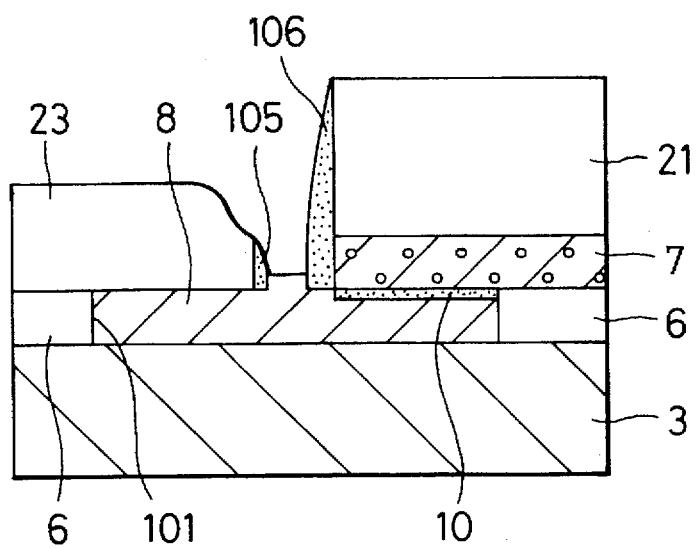

Subsequently, the base region 8 is epitaxially and selectively grown on the epitaxial layer 3 in the opening 101. As shown in FIG. 13C, the $p^+$-type polysilicon film 10 does not cover the side face of the polysilicon film 7, because this face is covered with the insulating sidewall 106.

Figure 13D:
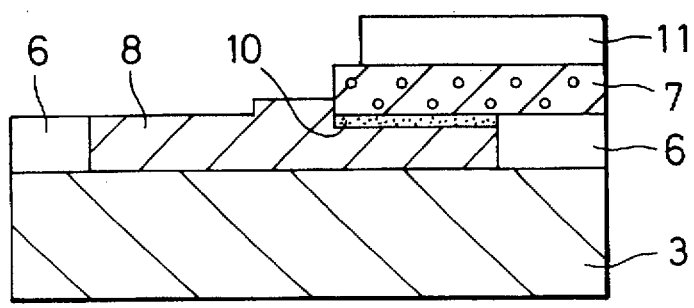

Further, the silicon dioxide films 23 is entirely removed and the silicon dioxide film 21 is partially removed in the same way as that of the first embodiment. During this process, the sidewalls 105 and 106 are also removed. The state at this stage is shown in FIG. 13D.

The subsequent process steps are the same as those in the first embodiment.

Figure 14:
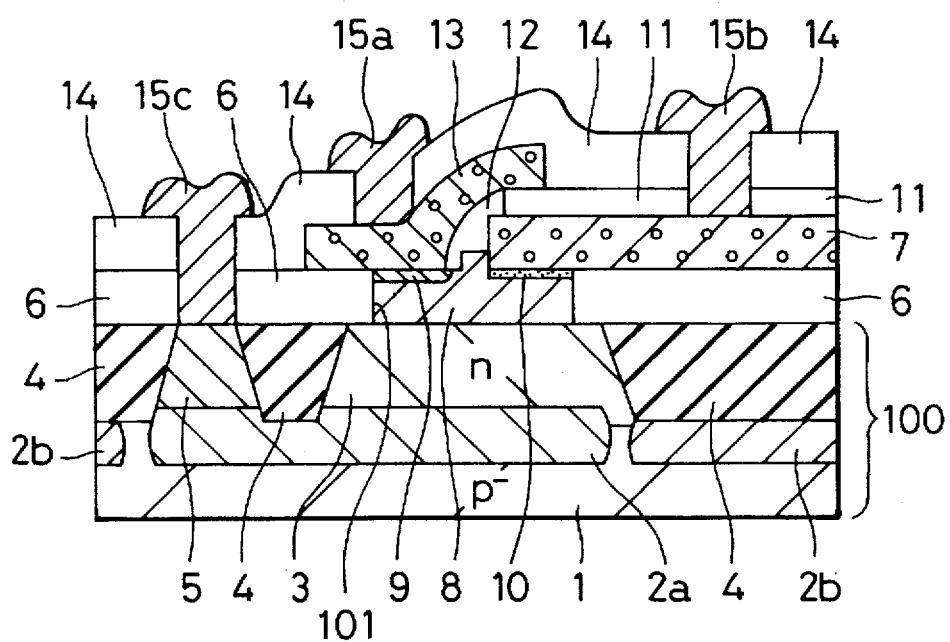
FIG. 14 is a partial cross-sectional view of the semiconductor device fabricated by the method according to the fifth embodiment of the invention.

FIG. 14 shows the semiconductor device fabricated by the method according to the fifth embodiment.

In the fifth embodiment, since the insulating sidewall 106 covers the side face of the polysilicon film 7, there is an advantage that the opening 103 is more difficult to be closed or narrowed by a laterally growing polysilicon film during the growth process for the base region 8 compared with the first embodiment. This advantage leads to reduction in collector-to-base capacitance and base resistance.

In the above embodiments, the emitter region is produced by doping the impurity into the base region from the $n^{++}$-type polysilicon film. However, the invention is not limited thereto. The emitter region may be formed by an epitaxial growth process. Also, a mixed crystal such as a SiGe alloy may be used for the base region instead of silicon.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, said method comprising the steps of:
   (a) forming a first insulating film on a first single-crystal semiconductor layer of a first conductivity type;
   (b) selectively forming a first polycrystalline semiconductor film and a second insulating film on said first insulating film, respectively, said first insulating film being exposed through a first opening formed between opposing ends of said first polycrystalline semiconductor film and said second insulating film;
   (c) selectively removing said first insulating film using said first polycrystalline semiconductor film and said second insulating film as a mask, thereby forming a second opening greater in plan size than said first opening;
   (d) epitaxially grow a second single-crystal semiconductor layer of said second conductivity type on said first single-crystal semiconductor layer in said second opening;
   (e) removing said second insulating film to expose a part of said second single-crystal semiconductor layer; and
   (f) forming a third single-crystal semiconductor layer of said first conductivity type in or on said exposed part of said second single-crystal semiconductor layer to thereby produce a p-n junction therebetween;
   wherein a thickness of said second single-crystal semiconductor layer is defined by a height of said second opening.

2. The method as claimed in claim 1, wherein said step (b) of foaming said first porycrystalline semiconductor film and said second insulation film is performed by the steps of:
   (b-1) selectively forming said first porycrystalline semiconductor film on said first insulating film;
   (b-2) selectively forming a third insulating film on said first porycrystalline semiconductor film;
   (b-3) forming a first insulating sidewall on a side face of said third insulating film;
   (b-4) thermally oxidizing said first porycrystalline semiconductor film using said third insulating film and said first insulating sidewall, thereby forming said second insulating film; and
   (b-5) removing said first insulating sidewall to remove said exposed first porycrystalline semiconductor film.

3. The method as claimed in claim 2, further comprising a step of forming a fourth insulating film with a third opening to cover said second insulating film between said steps of (b-4) and (b-5);

wherein a part of said first insulating sidewall existing in said third opening is removed in said step of (b-5).

4. The method as claimed in claim 1, further comprising a step of forming a fifth insulating film to cover an area where said first opening is formed between said steps of (e) and (f).

5. The method as claimed in claim 4, wherein said fifth insulating film is formed as a second insulating sidewall covering a side face of said third insulating film, said third insulating film is formed on said first polycrystalline semiconductor film.

6. The method as claimed in claim 1, further comprising a step of forming a sixth insulating film to cover an area where said first single-crystal semiconductor layer and said first insulating film are contacted with each other between said steps of (e) and (f).

7. The method as claimed in claim 1, wherein said step of (d) is performed by a gas-source MBE or UHV/CVD process.

* * * * *

UNITED STATES PATENT AND TRADEMARK OFFICE
CERTIFICATE OF CORRECTION

PATENT NO. : 5,723,378
DATED : March 3, 1998
INVENTOR(S) : Fumihiko Sato

It is certified that error appears in the above-identified patent and that said Letters Patent is hereby corrected as shown below:

Title Page Item 22, Filed, "March 31, 1996" should read --March 21, 1996--.

Claim 2, Col. 14, lines 49,51,54,57 and 62 "porycrystalline" should be --polycrystalline--.

Claim 2, Col. 14, line 50, "insulation" should be --insulating--.

Signed and Sealed this

Fourteenth Day of March, 2000

Attest:

Attesting Officer

Q. TODD DICKINSON

Commissioner of Patents and Trademarks